(12) United States Patent
Kikuchi et al.

(10) Patent No.: US 9,524,877 B2
(45) Date of Patent: Dec. 20, 2016

(54) SILICON DRY ETCHING METHOD

(71) Applicant: Central Glass Company, Limited, Ube-shi, Yamaguchi (JP)

(72) Inventors: Akiou Kikuchi, Ube (JP); Isamu Mori, Ube (JP); Masanori Watari, Ube (JP)

(73) Assignee: Central Glass Company, Limited, Ube-shi (JP)

( * ) Notice: Subject to any disclaimer, the term of this patent is extended or adjusted under 35 U.S.C. 154(b) by 0 days.

(21) Appl. No.: 14/765,413

(22) PCT Filed: Jan. 24, 2014

(86) PCT No.: PCT/JP2014/051452
§ 371 (c)(1),
(2) Date: Aug. 3, 2015

(87) PCT Pub. No.: WO2014/119474
PCT Pub. Date: Aug. 7, 2014

(65) Prior Publication Data
US 2016/0005612 A1    Jan. 7, 2016

(30) Foreign Application Priority Data
Feb. 1, 2013  (JP) .................................. 2013-018215

(51) Int. Cl.
*H01L 21/302* (2006.01)
*H01L 21/3065* (2006.01)

(52) U.S. Cl.
CPC ................................ *H01L 21/3065* (2013.01)

(58) Field of Classification Search
CPC .................................................. H01L 21/3065
(Continued)

(56) References Cited

U.S. PATENT DOCUMENTS 6,290,864 B1    9/2001  Patel et al.
6,581,612 B1 *  6/2003  Loewenhardt ...... C23C 16/4405
                                                134/1.1
(Continued)

FOREIGN PATENT DOCUMENTS

JP      3-293726        12/1991
JP      2004-518271     6/2004
(Continued)

OTHER PUBLICATIONS

Bailar, et al. "Comprehensive Inorganic Chemistry", 1973, pp. 1490-1497, vol. II, Pergamon Press Ltd., Rushcutters Bay, New South Wales, Australia (Six (6) pages).
(Continued)

*Primary Examiner* — Duy Deo
*Assistant Examiner* — Maki Angadi
(74) *Attorney, Agent, or Firm* — Crowell & Moring LLP (57) ABSTRACT

A dry etching method according to the present invention is for etching a silicon layer as a processing target in a processing room, characterized by supplying an iodine heptafluoride-containing etching gas from a gas supply source at a supply pressure of 66 kPa to 0.5 MPa, evacuating the processing room to an internal pressure lower than the supply pressure of the etching gas and, while maintaining the etching gas at the supply pressure, introducing the etching gas into the evacuated processing room so as to etch the silicon layer by the etching gas. It is possible by this dry etching method to etch the silicon upon adiabatic expansion of the etching gas under mild pressure conditions, with no fear of equipment load and equipment cost increase, and achieve good uniformity of in-plane etching amount distribution.

8 Claims, 3 Drawing Sheets

(58) Field of Classification Search
USPC ... 438/706; 216/58, 63, 73, 79; 252/79.1–79.4
See application file for complete search history.

(56) References Cited

U.S. PATENT DOCUMENTS

| | | |
|---|---|---|
| 6,949,202 B1 * | 9/2005 | Patel ............... B81C 1/00587 |
| | | 156/345.29 |
| 2010/0196251 A1 | 8/2010 | Shibayama et al. |
| 2011/0147896 A1 | 6/2011 | Koike et al. |

FOREIGN PATENT DOCUMENTS

| | | |
|---|---|---|
| JP | 2008-117209 | 5/2008 |
| JP | 2009-23896 A | 2/2009 |
| KR | 10-2004-0017792 A | 2/2004 |
| KR | 10-2011-0028542 A | 3/2011 |
| WO | WO 2010/021265 A1 | 2/2010 |

OTHER PUBLICATIONS

Korean-Language Office Action issued in counterpart Korean Application No. 10-2015-7023791 dated Sep. 13, 2016 (5 pages).

* cited by examiner

○ EXAMPLE 1-1   △ COMPARATIVE EXAMPLE 1-1   ◇ COMPARATIVE EXAMPLE 1-2

SILICON DRY ETCHING METHOD

FIELD OF THE INVENTION

The present invention relates to a method for dry etching of silicon with the use of iodine heptafluoride.

BACKGROUND ART

Silicon and its compounds are important and inevitable materials in the fields of semiconductors. These materials have a wide range of applications including, for example, silicon oxide films as gate insulators for semiconductor devices, amorphous silicon films and silicon nitride films as thin-film transistors, polysilicon films for three-dimensional structural elements such as MEMS, silicon carbide (SiC) films for low-power-consumption transistors and the like. Attention is particularly given to silicon semiconductor devices under the circumstance that the high-density integration of semiconductor elements, as typified by transistors for DRAM and flash memories, has been proceeding year after year.

During semiconductor manufacturing, silicon and its compounds are commonly processed into predetermined shapes or removed by predetermined manufacturing steps e.g. final manufacturing steps. Dry etching has been conventionally widely used for such processing and removal of silicon and its compounds. In the dry etching of silicon and its compounds, fine etching performance and high etching accuracy are required. Thus, in-plane etching uniformity and etching selectivity are regarded as important factors in view of wafer upsizing, fine pattern formation etc. It is also required to improve the etching rate for high productivity.

Conventionally, plasma dry etching methods have been widely used for etching of silicon. In the plasma dry etching methods, it is common practice to utilize fluorine-containing compounds such as $SF_6$ (sulfur hexafluoride) and $C_4F_8$ (perfluorocyclobutane) as etching gases. These etching gases are however questioned as a cause of global warming because of their very high global warming potential of several thousands to several tens of thousands. On the other hand, fluorine-containing interhalogen compounds are known as effective etching gases for etching of silicon because of their relatively low global warming potential and high reactivity against the silicon.

For example, Patent Document 1 discloses a method for anisotropic plasma etching of a silicon substrate with the use of an etching gas containing iodine fluoride as one kind of interhalogen compound.

In the conventional plasma etching methods, however, there occurs large electrical damage to samples by plasma. Concerns are thus rising that, in the case of plasma etching silicon on complicated shaped semiconductor elements, etching-resistant parts such as dielectric parts of the semiconductor elements may also become damaged.

As a solution to such a problem, researches have been made on methods for etching silicon and its compounds by so-called plasma-less etching treatment without the need for plasma excitation.

For example, Patent Document 2 discloses a method for processing a surface of a sample by plasma-less etching treatment without causing electrical or ultraviolet damage to the sample. In the plasma-less etching treatment, the sample surface is etched by generating reactive gas clusters upon abrupt adiabatic expansion of an etching gas due to a pressure difference between gas supply pipe pressure (primary pressure) and chamber inside pressure (secondary pressure), and then, ejecting the reactive gas clusters to the sample surface.

Patent Document 3 discloses a method for etching a silicon layer by plasma-less etching treatment with the use of a fluorine-containing interhalogen compound such as $BrF_3$, $ClF_3$ or $XeF_2$. It is described in this patent document that the etching selectivity of the silicon layer against metal or metal silicon can be improved with the addition of an inert gas such as nitrogen and argon to the interhalogen compound.

Patent Document 4 discloses a method for production of iodine heptafluoride (hereinafter sometimes referred to as "$IF_7$"). It is described in this patent document that iodine heptafluoride is usable as an etching gas. Further, Patent Document 5 discloses the use of a fluorine-containing interhalogen compound for etching of an oxide or semiconductor material.

There are however no reports that actually use iodine heptafluoride for etching applications and discuss the conditions of etching with iodine heptafluoride.

PRIOR ART DOCUMENTS

Patent Documents

Patent Document 1: Japanese Laid-Open Patent Publication No. 2008-177209
Patent Document 2: International Publication No. 2010/021265
Patent Document 3: U.S. Pat. No. 6,290,864
Patent Document 4: Japanese Laid-Open Patent Publication No. 2009-23896
Patent Document 5: Japanese Laid-Open Patent Publication No. H3-293726

SUMMARY OF THE INVENTION

Problems to be Solved by the Invention

In the etching method of Patent Document 2, an interhalogen compound (e.g. $ClF_3$) is mixed as a reactive etching gas with a low-boiling gas (such as inert gas e.g. argon or neon) such that liquefaction of the mixed supply gas does not occur even under high-pressure conditions. In other words, the etching method of Patent Document 2 is characterized in that the supply gas is maintained at a high pressure, without being liquefied, by the addition of the hard-to-liquefy low-boiling gas to the reactive gas. This allows, upon introduction of the high-pressure supply gas into an evacuated chamber, abrupt adiabatic expansion of the supply gas. As there is no plasma generated, it is possible to perform etching of the sample without causing electrical or ultraviolet damage to the sample.

In the etching method of Patent Document 2, the etching gas is supplied together with the low-boiling gas as mentioned above. It is thus necessary to apply a high pressure to the supply gas in order to cause adiabatic expansion of the supply gas. For example, the application of a pressure of 0.3 MPaG to 1.0 MPaG is required in the case where a mixed gas of 6 vol % $ClF_3$ as an etching gas component and 94 vol % Ar is used in the etching method of Patent Document 2. It is also necessary to provide a special shaped nozzle on an end of the gas supply pipe in order to maintain the supply gas at the high pressure. The use of such a special shaped nozzle is unfavorable due to cost increase. Consequently, the conventional etching method involving adiabatic expansion as in Patent Document 2 faces not only the problem of equipment load and equipment cost but also the problem that, if a sufficient pressure is not accidentally applied to the etching gas, it is impossible to cause adiabatic expansion of the etching gas so that the etching gas does not uniformly reach the sample and fails to attain uniformity of in-plane distribution due to variations in etching amount.

The present invention has been carried out in view of the above problems. It is an object of the present invention to provide a method for dry etching of silicon by adiabatic expansion of an etching gas, which is capable of supplying the etching gas under a milder pressure condition than conventional method, with no fear of equipment load and cost increase, and achieving good uniformity of in-plane etching amount distribution.

Means for Solving the Problems

The present inventors have made extensive researches to solve the above problems and resultantly identified iodine heptafluoride as an etching gas component. With focus on the sublimability as one specific chemical property of iodine heptafluoride, the present inventors have found that an etching gas containing iodine heptafluoride can easily undergo adiabatic expansion even under mild low-pressure conditions with less equipment load and with no need to add an additive gas such as inert gas to prevent liquefaction of the etching gas under high-pressure conditions. The present invention is based on such a finding.

Namely, the present invention provides a dry etching method for etching a silicon layer as a processing target in a processing room, comprising: supplying an etching gas containing iodine heptafluoride from a gas supply source at a supply pressure of 66 kPa to 0.5 MPa; evacuating the processing room to an internal pressure lower than the supply pressure; and, while maintaining the etching gas at the supply pressure, introducing the etching gas into the evacuated processing room so as to thereby etch the silicon layer by the etching gas.

This method enables adiabatic expansion of the etching gas in the processing room whose internal pressure has been set a lower level than the supply pressure of the etching gas, followed by adsorption of the etching gas to a surface of the silicon layer.

In the present invention, the iodine heptafluoride is preferably contained in an amount of 50 vol % or more in the etching gas. It is particularly preferable that the etching gas contains substantially no component other than the iodine heptafluoride.

It is also preferable in the present invention that the ratio Ps/Pn between the supply pressure (Ps) of the etching gas and the internal pressure (Pn) of the processing room is in the range of 20 to $1\times10^9$, more preferably 50 to $1\times10^7$. When the pressure ratio Ps/Pn is in the above specific range, the etching gas can be more effectively adiabatically expanded in view of equipment load.

It is further preferable in the present invention that the temperature of the processing target is in the range of −40° C. to 150° C.

In the present invention, the processing target may include at least the silicon layer and an etching-resistant part and allow the silicon layer to be selectively etched by the etching gas. Preferably, the etching-resistant part is formed of at least one material selected from $SiO_2$, SiN and TiN.

As mentioned above, the present invention utilizes the iodine heptafluoride-containing etching gas and enables adiabatic expansion of the etching gas under milder pressure conditions than conventional method. It is therefore possible in the present invention to etch the processing target silicon layer with good uniformity of in-plane etching amount distribution even under mile pressure conditions with no need to set the supply pressure of the etching gas to a high level and with no fear of equipment load and increase in equipment cost by nozzle modification etc.

DETAILED DESCRIPTION OF THE EMBODIMENTS

The dry etching method of the present invention is characterized by: supplying an etching gas containing iodine heptafluoride at a predetermined supply pressure from a gas supply source such as cylinder; evacuating a processing room to an internal pressure lower than the supply pressure of the etching gas; and, while maintaining the etching gas at the supply pressure, introducing the etching gas into the evacuated processing room such that the etching gas can be abruptly adiabatically expanded and thereby adsorbed onto a surface of the processing target silicon layer. It is herein noted that the dry etching method of the present invention is a plasma-less etching method that does not require plasma excitation.

When the etching gas is adiabatically expanded in the processing room, the iodine heptafluoride in the etching gas is adsorbed onto the surface of the processing target silicon layer by the action of the adiabatic expansion. Then, this etching gas component is condensed and liquefied on the surface of the processing target silicon layer. It is accordingly possible to maintain the uniform concentration of the etching gas component on the whole of the etching surface of the processing target silicon layer such as substrate during the progress of etching reaction, prevent difference in in-plane etching rate and suppress in-plane variations in etching amount. In particular, the iodine heptafluoride is characteristically used as the etching gas component so that the etching gas can easily undergo adiabatic expansion even under mild gas-supply-pressure conditions (e.g. where the supply pressure of the etching gas is of the order of 100 kPa). It is assumed that this characteristic feature results from the sublimability as one specific chemical property of the iodine heptafluoride.

The dry etching method of the present invention, which utilizes the iodine heptafluoride, will be hereinafter described in detail below.

There is no particular restriction on the iodine heptafluoride used in the dry etching method of the present invention. It is feasible to purchase and use industrially produced iodine heptafluoride. The iodine heptafluoride can be produced and made available by a known production process as disclosed in e.g. Japanese Laid-Open Patent Publication No. 2009-23896 which is an application of the present applicant.

Although the iodine heptafluoride can be used solely without the addition of an additive gas as an essential component, it is feasible to add an additive gas as required within the range that does not impair the effects of the present invention. In general, the iodine heptafluoride is preferably contained in an amount of 50 vol % or more, more preferably 80 vol % or more, in the etching gas. In order to achieve both of good in-plane etching uniformity and high etching rate, it is particularly preferable that the amount of the iodine heptafluoride contained in the etching gas is 100 vol %, that is, the etching gas contains substantially no component other than the iodine heptafluoride.

The expression "the etching gas contains substantially no component other than the iodine heptafluoride" means that any etching gas component other than the iodine heptafluoride is not added to the etching gas. The etching gas may however contain a slight amount of iodine pentafluoride, fluorine, hydrogen fluoride etc. derived from raw materials and mixed during common iodine heptafluoride production process.

In order to adjust the etching performance of the etching gas, an oxidizing gas and an inert gas may be added to the etching gas as required as the additive gas other than the iodine heptafluoride. In the case of adding the additive gas to the etching gas, the amount of the iodine heptafluoride contained in the etching gas is generally appropriately controlled to within the range of 1 to 100 vol %.

Examples of the oxidizing gas are: oxygen-containing gases such as $O_2$, $O_3$, $CO_2$, $COCl_2$, $COF_2$, $N_2O$, $NO$ and $NO_2$; and halogen gases such as $F_2$, $NF_3$, $Cl_2$, $Br_2$, $I_2$, $YF_n$ (Y=Cl, Br or I; $1 \leq n \leq 5$). Among others, $O_2$, $COF_2$, $F_2$, $NF_3$ and $Cl_2$ are preferred. The amount of the additive gas added to the etching gas is adjusted as appropriate depending on the performance and configuration of etching equipment used and the etching conditions.

The iodine heptafluoride used in the present invention is significantly different from conventionally used silicon etching gas $ClF_3$, in that the iodine heptafluoride is sublimable and thus likely to be vaporized. Because of such sublimability, the iodine heptafluoride does not become liquefied during supply through a supply pipe and can be easily adiabatically expanded. It has further been found that, because of its chemical properties, the iodine heptafluoride shows very high etching selectivity of silicon against etching-resistant part such as mask during silicon etching as compared to conventional silicon etching gases (as will be explained in detail later).

There is no particular restriction on the processing target in the dry etching method of the present invention. The processing target can be formed as a structural element such as semiconductor element with the silicon layer. As the processing target, preferred is a structural element such as semiconductor element having at least a silicon layer and an etching-resistant part that does not substantially react with the iodine heptafluoride. Alternatively, the processing target can be formed solely of silicon. It is thus feasible to apply the dry etching method for surface processing of a silicon substrate, such as formation of a trench or hole in a silicon substrate.

The silicon layer can suitably be a silicon layer for semiconductor manufacturing. Examples of such a silicon layer are an amorphous silicon film, a polysilicon film and a single crystal silicon film. The etching-resistant part can be used as a mask for processing the silicon layer into a predetermined shape or can be used as a structural element such as silicon element by removing the processing target silicon layer and being processed into a predetermined shape such as three-dimensional structure.

In the case where the etching-resistant part is used as the mask, the mask is formed with a predetermined pattern on the surface of the silicon layer so that the silicon layer is selectively etched by the etching gas through the mask. There is no particular restriction on the material of the mask as long as the material of the mask does not substantially react with the iodine heptafluoride. Examples of such a mask material are: $SiO_2$; SiOC; SiON; SiN; TiN; $TiO_2$; photoresist materials; carbon materials; and metal materials such as Ru, Cu, Ni, Co, Hf, Zf and oxides thereof. Among others, $SiO_2$, SiN and TiN are preferred (see Examples).

In the case where the etching-resistant part itself is used as the semiconductor structural element, the etching-resistant part is formed of a material that does not substantially react with iodine heptafluoride. Preferably, the etching-resistant part is formed of at least one material selected from the group consisting of $SiO_2$, SiN and TiN.

Taking as an example the semiconductor element provided with at least the silicon layer and the etching-resistant part that does not substantially react with the iodine heptafluoride, an explanation will be given of the reactivity of the iodine heptafluoride against the etching-resistant part during selective etching of the silicon layer.

It has been found that, in the case of etching silicon through the mask of SiN, TiN or the like, it is possible to attain very high etching selectivity of the silicon against the mask by the use of the iodine heptafluoride as the etching gas as in Examples as compared to the use of conventional etching gases such as $ClF_3$ and $XeF_2$. Each of the iodine heptafluoride and lower fluorinated iodine compound (such as $IF_5$) generated after the reaction of the iodine heptafluoride has a higher bond energy than those of $ClF_3$ and $XeF_2$ (see TABLE 1 below). Although the reaction mechanism is not clear, the iodine heptafluoride is high in bond energy and stable as a compound and thus shows lower reactivity against the mask material than those of $ClF_3$ and $XeF_2$. Further, the iodine heptafluoride is adsorbed by adiabatic expansion and then liquefied on the surface of the silicon layer and thus shows high etching rate. For these reasons, it is assumed that the iodine heptafluoride attains high etching selectivity. Herein, TABLE 1 is a quotation from J. C. BAILAR JR., COMREHENSIVE INORGANIC CHEMISTRY II, PERGAMON PRESS Ltd., 1973, p. 1491-1496.

TABLE 1

| | Molecular formula | | | | |
|---|---|---|---|---|---|
| | $XeF_2$ | $ClF_3$ | $BrF_5$ | $IF_7$ | $IF_5$ |
| Bond length/Å | d(Xe—F) = 1.93 | d(Cl—$F_{ax}$) = 1.716 | d(Br—$F_{api}$) = 1.689 | d(I—$F_{ax}$) = 1.786 | d(I—$F_{api}$) = 1.844 |
| Bond angle/° | | d(Cl—$F_{eq}$) = 1.621 | d(Br—$F_{bas}$) = 1.774 | d(I—$F_{eq}$) = 1.858 | d(I—$F_{bas}$) = 1.869 |
| | | ∠$F_{ax}$—Cl—$F_{eq}$ = 86.59 | ∠$F_{api}$—Br—$F_{bas}$ = 86.59 | | ∠$F_{api}$—I—$F_{bas}$ = 81.9 |
| Molecular size/Å$^3$ | 41.0 | 47.0 | 66.7 | 85.2 | 71.4 |
| X—F Bond energy kcal/mol | 31.7 | 41.7 | 44.7 | 55.4 | 64.2 |

Next, an explanation will be given of the reaction conditions in the dry etching method of the present invention.

In order to cause adiabatic expansion of the etching gas in the processing room such as chamber, the etching gas is supplied while maintained at the predetermined supply pressure. The supply pressure of the etching gas is generally in the range of 66 kPa to 0.5 MPa, preferably 101 kPa to 300 kPa. If the etching gas is supplied at a pressure lower than 66 kPa, it is impossible to cause sufficient adiabatic expansion of the etching gas. It is unnecessary to supply the etching gas at a pressure higher than 0.5 MPa in view of equipment load.

During the etching reaction, the processing pressure is generally in the range of 1 Pa to 3 kPa. In order to attain higher substrate in-plane uniformity, the processing pressure is preferably in the range of 5 Pa to 1.5 kPa.

There is no particular restriction on the internal pressure of the processing room before the introduction of the etching gas as long as the internal pressure of the processing room is in the range that causes adiabatic expansion of the etching gas. The internal pressure of the processing room before the introduction of the etching gas is generally in the range of $10^{-5}$ Pa to 10 kPa, preferably 1 Pa to 1.5 kPa.

In order to effectively cause adiabatic expansion of the etching gas, it is particularly preferable to control the difference between the supply pressure of the etching gas (primary pressure) and the internal pressure of the processing room (secondary pressure) to within a predetermined range. More specifically, it is preferable that the ratio Rs/Pn between the supply pressure (Ps) of the etching gas and the internal pressure (Pn) of the processing room is in the range of 20 to 1000000000 ($1 \times 10^9$). In order to more effectively cause adiabatic expansion of the etching gas in view of equipment load, the pressure ratio Ps/Pn is more preferably in the range of 50 to 10000000 ($1 \times 10^7$), still more preferably 50 to 10000 ($1 \times 10^4$). When the pressure ratio Ps/Pn is in the above range, the difference between the primary pressure and the secondary pressure is very small so that the etching reaction proceeds under mild conditions as compared to conventional etching method involving adiabatic expansion.

The temperature of the processing target silicon layer is generally in the range of −40° C. to 150° C. in order to bring the etching gas into contact with the silicon layer and preferentially etch the silicon layer by adsorption of the etching gas. In order to attain higher in-plane uniformity with respect to the etching rate, the temperature of the silicon layer is preferably in the range of −10° C. to 80° C.

There is no particular restriction on the etching time. The etching time is preferably 60 minutes or shorter in view of semiconductor manufacturing efficiency. Herein, the etching time refers to a time from the introduction of the etching gas into the processing room in which the substrate has been placed as the etching target to the discharge of the etching gas out of the processing room by a vacuum pump etc. for completion of the etching reaction.

Figure 1:
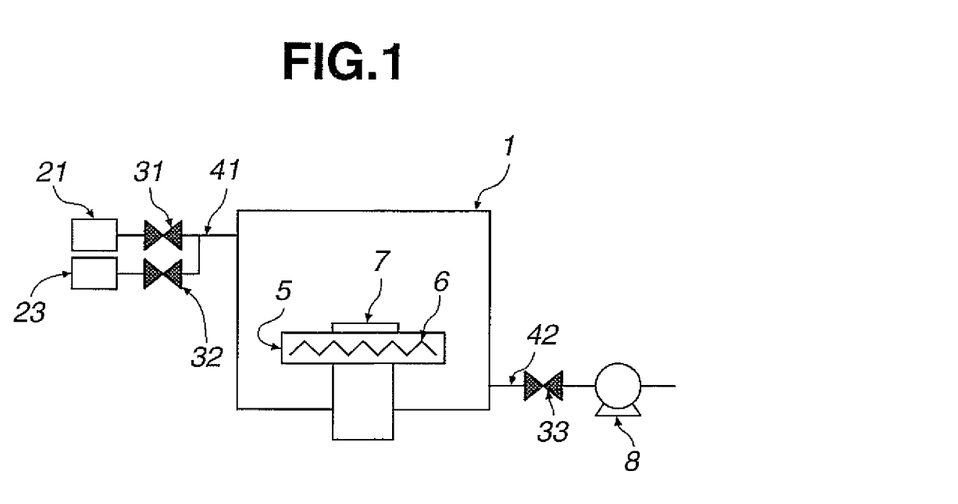
FIG. 1 is a schematic view of an etching apparatus used in each of Examples and Comparative Examples.

The dry etching method of the present invention is applicable to common etching equipment for use in semiconductor manufacturing as shown in FIG. 1. There is no particular restriction on the configuration of the etching equipment used. For example, it is feasible to use an ordinary gas pipe without the need to provide a specific shaped gas ejection portion for adiabatic expansion of the etching gas. Further, there is no particular restriction on the positional relationship between the gas supply pipe and the processing target such as semiconductor element in the processing room as long as the adiabatically expanded etching gas is brought into contact with the processing target.

There is no particular restriction on the processing room used in the dry etching method of the present invention as long as the processing room has resistance to fluorine-containing gas and can be evacuated to the predetermined pressure level. In general, a reaction chamber of the semiconductor etching equipment is usable as the processing room. There is also no particular restriction on the supply pipe for supplying and maintaining the iodine heptafluoride-containing etching gas at the predetermined pressure level and on the other pipes used in the dry etching method of the present invention. Ordinary pipes can be used as long as these pipes have resistance to fluorine-containing gas.

EXAMPLES

The present invention will be described in more detail below by way of the following examples. It should be understood that the following examples are illustrative and are not intended to limit the present invention thereto.

The configuration of an etching apparatus used in the following examples will be first explained below. FIG. 1 shows a schematic view of the etching apparatus used in each of Examples and Comparative Examples.

In the etching apparatus, a reaction chamber 1 was equipped with a sample stage 5 to support thereon a test sample 7. The test sample 7 used herein had a silicon substrate of 6 inches diameter, a silicon oxide film (thickness: 20 nm) formed on the silicon substrate and a polysilicon film (thickness: 30 μm) formed on the silicon oxide film. A stage temperature adjusting device 6 was provided in the sample stage 5 so as to adjust the temperature of the sample stage 5. Gas pipes 41 and 42 are connected to the reaction chamber 1 for gas introduction and discharge.

An etching gas supply system 21 and a diluent gas supply system 23 are connected to the gas pipe 41 through valves 31 and 31, respectively. For gas discharge, a vacuum pump 8 was connected to the gas pipe 42 through a valve 33. A pressure gauge (not shown) was attached to the reaction chamber 1. The internal pressure of the reaction chamber 1 was controlled by the valve 33 based on the reading of the pressure gage.

Next, the operations of the etching apparatus will be explained below.

The test sample 7 was placed on the sample stage 5. The reaction chamber 1 and the gas pipes 41 and 42 were evacuated to 1.5 kPa. The temperature of the sample stage 5 was set to a given degree. After confirming that the temperature of the sample stage 5 reached the given degree, the valves 31, 32 and 33 are opened so that the pressure of the etching gas supply system 21 was set to a given level. Then, an etching gas was introduced into the reaction chamber 1 through the gas pipe 41. The total flow rate of the etching gas was herein controlled to 100 sccm. In the case where the supply of a diluent gas was required, the diluent gas was supplied at a predetermined flow rate from the diluent gas supply system 23 as required.

After the lapse pf a predetermined time (etching time: 2 minutes) from the introduction of the etching gas, the introduction of the etching gas was stopped. The reaction chamber 1 was evacuated. The test sample 7 was then taken out of the reaction chamber 1 and evaluated for the etching rate and the uniformity of in-plane etching amount distribution.

Using the polysilicon film-coated silicon substrate (test sample 7), the thickness of the polysilicon film before and after the etching was measured at a plurality of positions. The values of the etching amount (i.e. difference in the thickness of the polysilicon film before and after the etching) at the respective measurement positions were determined from the measurement results. Further, the etching rate was determined from an average value of the etching amount values at the respective measurement points and the etching time. The in-plane distribution of the etching amount was determined based on the above determination results.

The in-plane distribution of the etching amount was herein given by the following equation (1): (Max−Min)/2Ave×100 where, among the determined etching amount values of the polysilicon film-coated silicon substrate (test sample 7), Max was the maximum etching amount; Min was the minimum etching amount value; and Ave was the average value of the etching amount values. The larger the value of the in-plane etching amount distribution, the larger the variations in etching amount.

Figure 2:
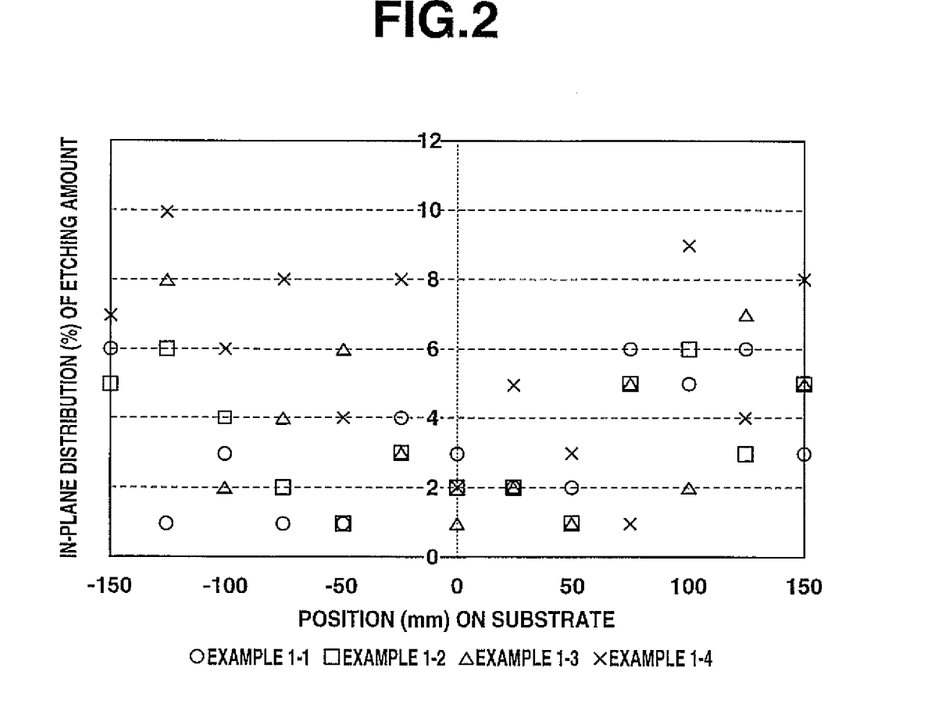
FIG. 2 is a graph showing an in-plane distribution of etching amount.
Figure 3:
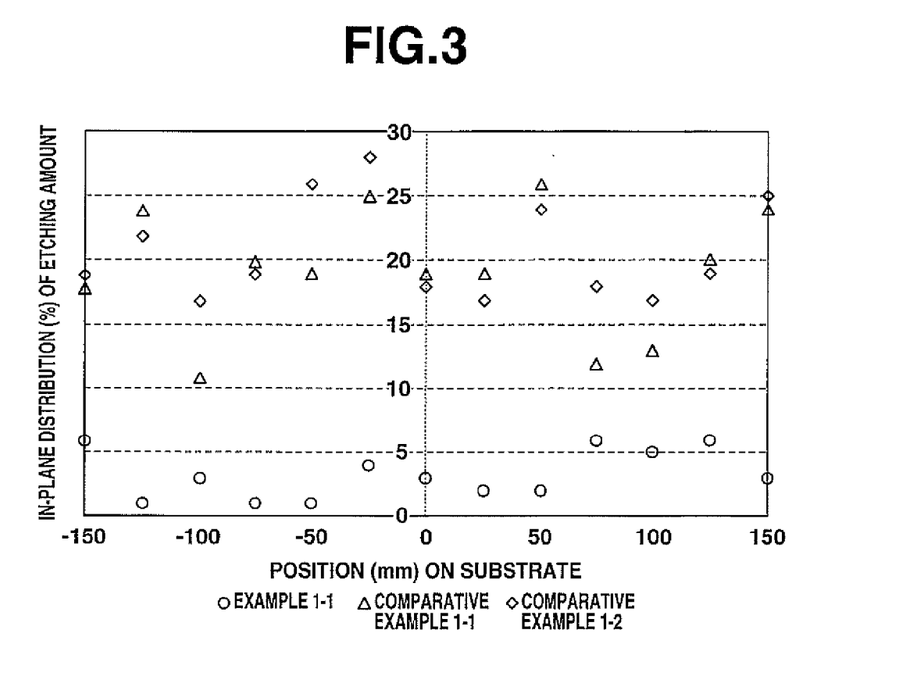
FIG. 3 is a graph showing an in-plane distribution of etching amount.
Figure 4:
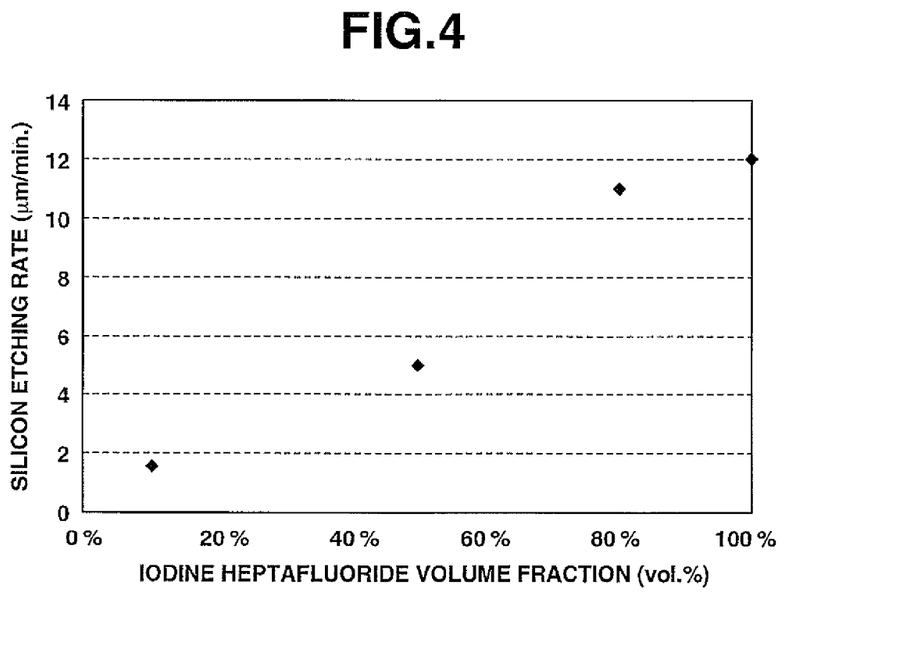
FIG. 4 is a graph showing a relationship between the volume fraction of iodine heptafluoride and the etching rate.

TABLE 2 shows the etching conditions and the in-plane etching amount distribution and etching rate evaluation results of Examples and Comparative Examples. FIGS. 2 and 3 show the in-plane etching amount distributions. FIG. 4 shows the relationship between the volume fraction of the iodine heptafluoride and the etching rate.

Example 1-1

The sample was subjected to etching test with the use of the etching gas containing substantially no component other than iodine heptafluoride ($IF_7$, volume fraction: 100%, no diluent gas). As to the etching conditions, the supply gas of the etching gas was set to 100 Pa; the etching processing pressure inside the chamber was set to 1 kPa; the total flow rate of the etching gas was set to 100 sccm; and the temperature of the silicon substrate was set to 30° C. As a result, the in-plane etching amount distribution of the sample after the etching test was 1 to 6%. The sample thus had good in-plane etching uniformity. Further, the etching rate was at a favorable level of 12 μm/min. In Example 1-1, the ratio Ps/Pn between the supply pressure (Ps) of the etching gas and the internal pressure (Pn) of the processing room was 66.

Example 1-2

The etching test was performed under the same conditions as those in Example 1-1 except that the etching gas contained 80 vol % of iodine heptafluoride (and 20 vol % of Ar gas). As a result, the in-plane etching amount distribution of the sample after the etching test was 1 to 6% as in the case of Example 1-1. The sample thus had good in-plane etching uniformity. The etching rate was at a favorable level of 11 μm/min.

Example 1-3

The etching test was performed under the same conditions as those in Example 1-1 except that the etching gas contained 50 vol % of iodine heptafluoride (and 50 vol % of Ar gas). As a result, the in-plane etching amount distribution of the sample after the etching test was 1 to 8%. The sample had generally satisfactory in-plane etching uniformity although it was slightly inferior to those in Examples 1-1 and 1-2. The etching rate was at a relatively favorable level of 5 μm/min although it was lower than that in Example 1-1.

Example 1-4

The etching test was performed under the same conditions as those in Example 1-1 except that the etching gas contained 10 vol % of iodine heptafluoride (and 90 vol % of $N_2$ gas). As a result, the in-plane distribution of the sample after the etching test was 1 to 11%. There was seen some etching variations in the sample as compared to that in Example 1-1. The etching rate was 1.2 μm/min and was lower than that in Example 1-1.

Example 1-5

The etching test was performed under the same conditions as those in Example 1-1 except that the temperature of the silicon substrate was set to −30° C. As a result, the in-plane etching amount distribution of the sample after the etching test was 1 to 8%. The sample had generally satisfactory in-plane etching uniformity although it was slightly inferior to those in Examples 1-1 and 1-2. The etching rate was at a relatively favorable level of 5 μm/min although it was lower than that in Example 1-1.

Example 1-6

The etching test was performed under the same conditions as those in Example 1-1 except that the temperature of the silicon substrate was set to 110° C. The etching rate was 14 μm/min and was equivalent to that in Example 1-1. The in-plane etching amount distribution of the sample after the etching test was 1 to 11%. There was seen some etching variations in the sample as compared to that in Example 1-1.

Comparative Example 1-1

The etching test was performed under the same conditions as those in Example 1-1 except that the test condition (etching gas supply pressure: 20 Pa) was changed so as not to cause sufficient adiabatic expansion of the etching gas. The etching rate was at a favorable level of 12 μm/min.

However, the in-plane etching amount distribution of the sample after the etching test was 11 to 25%. There were seen large in-plane etching variations in the sample. In Comparative Example 1-1, the ratio Ps/Pn between the supply pressure (Ps) of the etching gas and the internal pressure (Pn) of the processing room was 13.

Comparative Example 1-2

The etching test was performed under the same conditions as those in Example 1-1 except a conventional silicon etching gas $ClF_3$ (chlorine trifluoride) was used. The etching rate was at a favorable level of 12 μm/min. However, the in-plane etching amount distribution of the sample after the etching test was 17 to 28%. There was seen large in-plane etching variations in the sample.

It has been shown by the results of Examples 1-1 to 1-6 that, by the use of the etching gas containing the iodine heptafluoride, it is possible to easily cause adiabatic expansion of the etching gas under mild pressure condition of the order of 100 Pa, without equipment load, so that the silicon layer can be effectively etched by the etching gas. It has also been shown by the results of Examples 1-1 to 1-4 that it is possible to obtain higher etching rate and better in-plane etching uniformity as the volume fraction of the iodine heptafluoride in the etching gas increases.

In Comparative Example 1-1, there did not occur adiabatic expansion of the etching gas under gas supply pressure condition of 20 kPa so that it was impossible to each the silicon layer with good in-plane etching uniformity. In the case of the conventional etching gas ($ClF_3$) as used in Comparative Example 1-2, there occurred large in-plane etching variations under mild pressure condition. The reason for this is assumed that it was impossible to cause sufficient adiabatic expansion of the conventional etching gas.

etching selectivity of the silicon layer against the mask material (hereinafter sometimes referred to as "selectivity" for convenience sake). FIG. 3 shows the evaluation results. In Comparative Examples, the etching rate and selectivity were tested using various kinds of conventional fluorine-containing etching gases.

Example 2-1

Figure 5A:
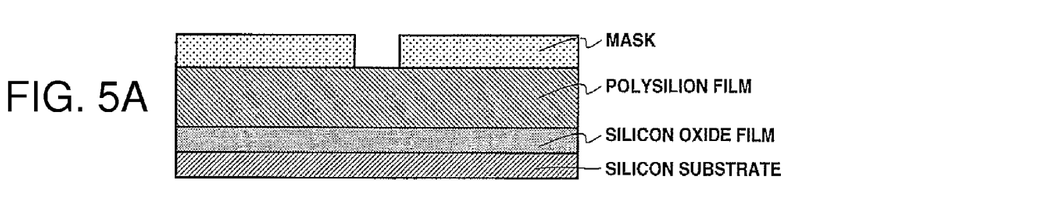
FIGS. 5A and 5B are schematic section views of an etching sample used in each of Examples and Comparative Examples.
Figure 5B:
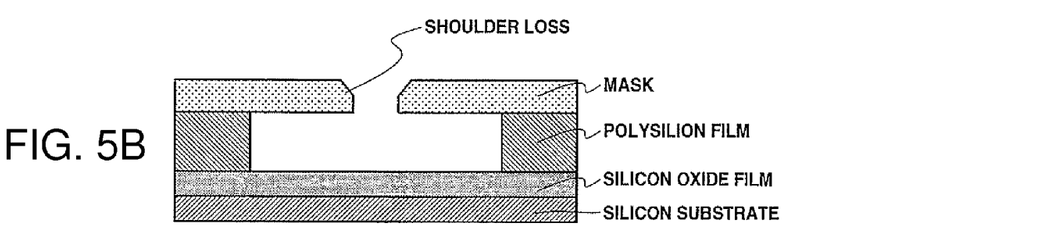

Using the etching apparatus of FIG. 1 used in Example 1-1, the etching test was performed on the mask-applied test sample of FIG. 5. The etching gas was 100 vol % iodine heptafluoride. The etching conditions were the same as those in Example 1-1 except that the etching processing pressure was set to 200 Pa. As a result, the iodine heptafluoride used as the etching gas showed good etching selectivity of the silicon layer against SiN, TiN and $SiO_2$. When the processing shape of the test sample in the vicinity of an opening of the mask material was observed, there was seen no shoulder loss of the mask material. The etched side wall of the polysilicon layer was good in shape. It is herein noted that, in the case where $SiO_2$ was used as the mask material, the mask material $SiO_2$ was not etched by any of $IF_7$, $XeF_2$, $ClF_3$, $BrF_5$, $IF_5$ and $F_2$.

Comparative Examples 2-1 to 2-5

The etching test was performed under the same conditions as those in Example 2-1 except that: $XeF_2$, $ClF_3$, $BrF_5$, $IF_5$ or $F_2$ was used as the etching gas; and the etching processing pressure was set to 30, 50, 150, 90 or 200 Pa. In the etching test, each etching gas was used without dilution by a diluent

TABLE 2

| | Kind of gas | Volume (%) | Supply pressure (kPa) | Substrate temperature (° C.) | Etching rate (μm/min) | In-plane distribution (%) |
|---|---|---|---|---|---|---|
| Example 1-1 | $IF_7$ | 100 | 100 | 30 | 12 | 1~6 |
| Example 1-2 | $IF_7$/Ar | 80/20 | 100 | 30 | 11 | 1~6 |
| Example 1-3 | $IF_7$/Ar | 50/50 | 100 | 30 | 5 | 1~8 |
| Example 1-4 | $IF_7$/$N_2$ | 10/90 | 100 | 30 | 1.2 | 1~11 |
| Example 1-5 | $IF_7$ | 100 | 100 | −30 | 5 | 1~8 |
| Example 1-6 | $IF_7$ | 100 | 100 | 110 | 14 | 1~11 |
| Comparative Example 1-1 | $IF_7$ | 100 | 20 | 30 | 12 | 11~25 |
| Comparative Example 1-2 | $ClF_3$ | 100 | 100 | 30 | 5 | 17~28 |

As experimental examples, test samples were provided with silicon layers and etched by the dry etching method of the present invention for shape processing of the silicon layers. Each of the test samples used had a silicon substrate, a silicon oxide film (thickness: 20 nm) formed on the silicon substrate, a polysilicon film (thickness: 30 μm) formed on the silicon oxide film and a mask material applied with a thickness of 50 nm as an etching mask to a surface of the polysilicon film. FIG. 5(a) shows a schematic section view of the etching test sample used in each of Examples and Comparative Examples; and FIG. 5(b) shows a schematic section view of the etching test sample after the etching. Herein, $SiO_2$, SiN or TiN was used as the mask material.

The test sample of FIG. 5 was subjected to etching test and evaluated for the etching rate of the silicon layer and the gas. As a result, $XeF_2$ did not show good selectivity against SiN and TiN. Each of $ClF_3$ and $BrF_5$ showed good selectivity against TiN but did not show good selectivity against SiN. Although $IF_5$ and $F_2$ had better selectivity than those of $XeF_2$, $ClF_3$ and $BrF_5$, the selectivity of each of $IF_5$ and $F_2$ was inferior to that of $IF_7$ used in Example 2-1.

It has been shown by comparison of the results of Example 2-1 and Comparative Examples 2-1 to 2-5 that the iodine heptafluoride used in the present invention has better silicon etching selectivity against SiN and TiN than the conventional fluorine-containing etching gases and, when used as the etching gas for etching of the silicon layer, provides high flexibility in the selection of the mask material etc.

TABLE 3

| | Kind of gas | Etching rate (nm/min) | | | Selectivity | |
| | | Etching target material | Mask material | | | |
| | | Si | SiN | TiN | Si/SiN | Si/TiN |
|---|---|---|---|---|---|---|
| Example 2-1 | IF$_7$ | 3947 | 0.03 | <0.01 | $1.47 \times 10^5$ | $>3.00 \times 10^5$ |
| Comparative Example 2-1 | XeF$_2$ | 2260 | >15 | >10 | 100 | 200 |
| Comparative Example 2-2 | ClF$_3$ | 81.8 | 0.12 | 0.05 | 682 | $1.63 \times 10^3$ |
| Comparative Example 2-3 | BrF$_5$ | 10.4 | 0.04 | <0.01 | 260 | $>1.00 \times 10^3$ |
| Comparative Example 2-4 | IF$_5$ | 2.2 | <0.01 | <0.01 | >200 | >200 |
| Comparative Example 2-5 | F$_2$ | 1.7 | 0.01 | <0.01 | >100 | >100 |

INDUSTRIAL APPLICABILITY

The present invention is useful for fine processing of silicon layers by etching during manufacturing of semiconductor devices.

The invention claimed is:

1. A plasma-less dry etching method for etching a silicon layer as a processing target in a processing room, comprising:
supplying an iodine heptafluoride-containing etching gas from a gas supply source at a supply pressure of 66 kPa to 0.5 MPa;
evacuating the processing room to an internal pressure lower than the supply pressure of the etching gas; and,
while maintaining the etching gas at the supply pressure, introducing the etching gas into the evacuated processing room so as to etch the silicon layer by the etching gas,
wherein the ratio Ps/Pn between the supply pressure (Ps) of the etching gas and the internal pressure (Pn) of the processing room is in a range of 20 to $1 \times 10^9$, and
wherein plasma excitation is not required.

2. The plasma-less dry etching method according to claim 1, wherein the iodine heptafluoride is contained in an amount of 50 vol % or more in the etching gas.

3. The plasma-less dry etching method according to claim 2, wherein the etching gas contains substantially no component other than iodine heptafluoride.

4. The plasma-less dry etching method according to claim 3, wherein the ratio Ps/Pn is in the range of 20 to $1 \times 10^9$; and wherein the temperature of the processing target is −40° C. to 150° C.

5. The plasma-less dry etching method according to claim 1, wherein the temperature of the processing target is −40° C. to 150° C.

6. The plasma-less dry etching method according to claim 1, wherein the processing target includes at least the silicon layer and an etching-resistant part such that the silicon target can be selectively etched by the etching gas.

7. The plasma-less dry etching method according to claim 6, wherein the etching-resistant part is formed of at least one material selected from the group consisting of SiO$_2$, SiN and TiN.

8. The plasma-less dry etching method according to claim 1, wherein the ratio Ps/Pn is in the range of 50 to $1 \times 10^7$.

* * * * *